(12) United States Patent
Gruber et al.

(10) Patent No.: US 11,901,908 B2
(45) Date of Patent: *Feb. 13, 2024

(54) DIGITAL-TO-ANALOG CONVERTER, DATA PROCESSING SYSTEM, BASE STATION, AND MOBILE DEVICE

(71) Applicant: Intel Corporation, Santa Clara, CA (US)

(72) Inventors: Daniel Gruber, St. Andrae (AT); Kameran Azadet, San Ramon, CA (US); Yu-Shan Wang, Hillsboro, OR (US); Hundo Shin, Santa Clara, CA (US); Martin Clara, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/754,148

(22) PCT Filed: Dec. 23, 2019

(86) PCT No.: PCT/US2019/068225
§ 371 (c)(1),
(2) Date: Mar. 25, 2022

(87) PCT Pub. No.: WO2021/133371
PCT Pub. Date: Jul. 1, 2021

(65) Prior Publication Data
US 2022/0294462 A1 Sep. 15, 2022

(51) Int. Cl.
*H04B 1/04* (2006.01)
*H03M 1/06* (2006.01)
*H04B 1/10* (2006.01)

(52) U.S. Cl.
CPC ........ *H03M 1/0614* (2013.01); *H04B 1/0475* (2013.01); *H04B 1/1018* (2013.01)

(58) Field of Classification Search
CPC .......... H04B 1/04; H04B 1/0475; H04B 1/40; H04B 1/10; H04B 1/1018; H04B 1/16; H03M 1/0614
(Continued)

(56) References Cited

U.S. PATENT DOCUMENTS

| 4,947,169 A | 8/1990 | Smith et al. |
| 7,372,386 B1 * | 5/2008 | Maloberti ........... H03M 1/0836 341/137 |

(Continued)

FOREIGN PATENT DOCUMENTS

| JP | 2019169908 A | * 10/2019 |
| WO | 2016028438 A1 | 2/2016 |

*Primary Examiner* — Emmanuel Bayard
(74) *Attorney, Agent, or Firm* — 2SPL Patent Attorneys PartG mbB; Kieran O'Leary

(57) ABSTRACT

A Digital-to-Analog Converter, DAC, is provided. The DAC comprises one or more first DAC cells configured to generate a first analog signal based on first digital data. The one or more first DAC cells are coupled to a first output node for coupling to a first load. The DAC comprises one or more second DAC cells configured to generate a second analog signal based on second digital data. The one or more second DAC cells are coupled to a second output node for coupling to a second load. The one or more first DAC cells and the one or more second DAC cells are couplable to a power supply for drawing a supply current. The DAC further comprises a data generation circuit configured to generate the second digital data based on the first digital data.

20 Claims, 5 Drawing Sheets

(58) Field of Classification Search
USPC ................ 375/219, 222, 295–297, 346, 350
See application file for complete search history.

(56) References Cited

U.S. PATENT DOCUMENTS

| | | |
|---|---|---|
| 9,716,508 B1 | 7/2017 | Zhang |
| 9,900,016 B1 | 2/2018 | Trampitsch et al. |
| 10,516,412 B1* | 12/2019 | Mehdizad Taleie .. H03M 1/662 |
| 10,727,853 B1* | 7/2020 | Zhao .................... H03M 1/124 |
| 10,749,543 B1* | 8/2020 | Terry .................... H03M 1/662 |
| 10,965,302 B1* | 3/2021 | Zhao ................. H03M 1/1033 |
| 2002/0047792 A1 | 4/2002 | Van Den Boom et al. |
| 2004/0119621 A1* | 6/2004 | Khoini-Poorfard ......................... H03M 1/0678 341/141 |
| 2010/0328124 A1* | 12/2010 | O'Donnell .......... H03M 1/0836 341/143 |
| 2012/0183083 A1 | 7/2012 | Kolze |
| 2013/0076549 A1 | 3/2013 | Bajdechi et al. |
| 2014/0063348 A1* | 3/2014 | Verlinden ............ H03M 1/662 348/E5.062 |
| 2014/0133524 A1 | 5/2014 | Wong |
| 2015/0256192 A1* | 9/2015 | Gutta ................. H03M 1/0617 341/118 |
| 2016/0182080 A1* | 6/2016 | Vasani ................ H03M 1/1028 341/145 |

\* cited by examiner

DIGITAL-TO-ANALOG CONVERTER, DATA PROCESSING SYSTEM, BASE STATION, AND MOBILE DEVICE

FIELD

The present disclosure relates to digital-to-analog conversion. In particular, examples relate to a Digital-to-Analog Converter (DAC), a data processing system, a base station and a mobile device.

BACKGROUND

Linearity performance of a Capacitive DAC (CDAC) depends primarily on the impedance of the reference power supply. A finite impedance of the reference power supply subject to normal data switching in a CDAC leads to an (attenuated and phase-shifted) rectified version of the CDAC output signal that develops on the reference power supply. This signal content on the reference supply is subsequently multiplied with the CDAC output signal and leads to harmonic distortions in the CDAC output signal (e.g. third and higher order harmonics).

Hence, there may be a desire for an improved DAC architecture.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
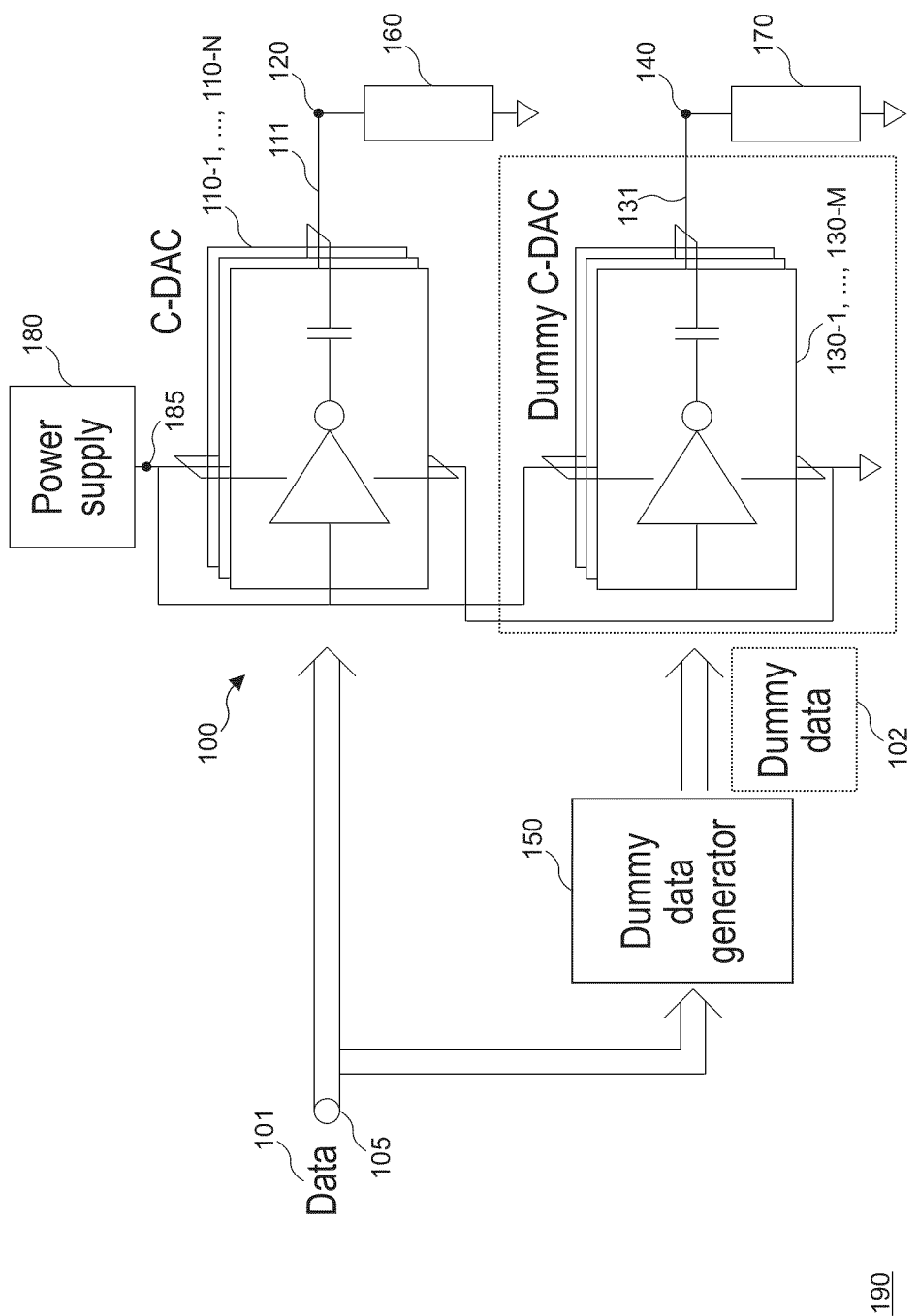
FIG. 1 illustrates an example of a data processing system comprising a DAC.

FIG. 1 illustrates an example of data processing system 190 comprising a DAC 100 according to the proposed architecture. For example, the data processing system 190 may be a (e.g. wireless or wired) transmitter or any other system that uses digital-to-analog conversion.

The DAC 100 comprises a plurality of first DAC cells 110-1, . . . , 110-N configured to generate a first analog signal 111 based on first digital data (digital input data) 101. The plurality of first DAC cells 110-1, . . . , 110-N may be any number N≥2 of DAC cells (e.g. related to a desired resolution of the DAC). The plurality of first DAC cells 110-1, . . . , 110-N are coupled to a first output node 120 of the DAC 100 for coupling to a first load 160. The first load 160 may any device couplable to the DAC 100 for further processing the first analog signal 111 of the DAC 100. For example, the first load may be a filter, an up-converter (mixer), a Power Amplifier (PA) or an antenna.

The DAC 100 additionally comprises a plurality of second DAC cells 130-1, . . . , 130-M configured to generate a second analog signal 131 based on second digital data (digital dummy data) 102. The plurality of second DAC cells 130-1, . . . , 130-M may be any number M≥2 of DAC cells. In particular, the number M of the DAC cells 130-1, . . . , 130-M may be equal to the number N of the DAC cells 110-1, . . . , 110-N. The plurality of second DAC cells 130-1, . . . , 130-M are coupled to a second output node 140 of the DAC 100 for coupling to a second load (dummy load) 170.

Although the proposed DAC architecture is described below with respect to the plurality of first DAC cells 110-1, . . . , 110-N and the plurality of second DAC cells 130-1, . . . , 130-M, it is to be noted that the proposed DAC architecture may as well be used for a DAC comprising only one first DAC cell and only one second DAC cell.

The first digital data 101 is received by an input node 105 of the DAC 100 and is information that contains useful data (e.g. data to be transmitted such as user data). As indicated in FIG. 1, the plurality of first DAC cells 110-1, . . . , 110-N are driven based on the first digital data 101. For example, the DAC 100 may comprises one or more circuits configured to generate and supply one or more respective drive signals to the plurality of first DAC cells 110-1, . . . , 110-N for activating and/or driving one or more of the plurality of first DAC cells 110-1, . . . , 110-N in order to generate a respective cell output signal contributing to the first analog signal 111 (e.g. one or more cell output signals generated by one or more of the plurality of first DAC cells 110-1, . . . , 110-N may be combined to the first analog signal 111).

The second digital data 102 is different from the first digital data 101. The second digital data 102 is information that does not contain any useful data (i.e. dummy data) in contrast to the first digital data 101. Accordingly, the second load 170 is a load that terminates the second analog signal 131 (e.g. the second load 170 couples the second output node 140 to ground). In other words, the second analog signal 131 is not further processed. For example, the second load 170 may be a resistive element (resistor) coupling the second output node 140 to ground.

A (dummy) data generation circuit 150 of the DAC 100 is configured to receive the first digital data 101 and to generate the second digital data 102 based on the first digital data 101. As indicated in FIG. 1, the plurality of second DAC cells 130-1, . . . , 130-M are driven based on the second digital data 102. For example, the DAC 100 may comprises one or more circuits configured to generate and supply one or more respective drive signals to the plurality of second DAC cells 130-1, . . . , 130-M for activating and/or driving one or more of the plurality of second DAC cells 130-1, . . . , 130-M in order to generate a respective cell output signal contributing to the second analog signal 131 (e.g. one or more cell output signals generated by one or more of the plurality of second DAC cells 130-1, . . . , 130-M may be combined to the second analog signal 131).

As indicated in FIG. 1, the plurality of first DAC converter cells 110-1, . . . , 110-N and the plurality of second DAC cells 130-1, . . . , 130-M are couplable to a power supply 180 for drawing a supply current from the power supply 180. For example, the DAC 100 may comprise a power input node 185 for coupling to the power supply 180. The plurality of first DAC converter cells 110-1, . . . , 110-N and the plurality of second DAC cells 130-1, . . . , 130-M are coupled to the power input node 185 such that they are couplable to the power supply 180 via the power input node 185.

Driving the plurality of second DAC cells 130-1, . . . , 130-M based on the dummy data 102 may allow to decorrelate the supply current from the first digital data 101. For example, driving the plurality of second DAC cells 130-1, . . . , 130-M based on the dummy data 102 may enable a first digital data 101 independent supply current. This may enable to improve the linearity of the DAC 100 beyond what is practically feasible by making the impedance of the power supply 180 as low as possible.

Figure 2:
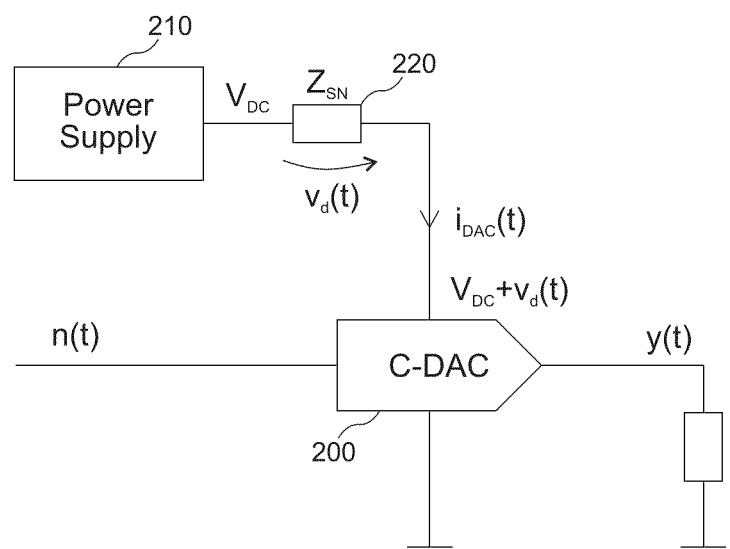
FIG. 2 illustrates a power supply schematic.

The above described technical effect of the dummy data driven plurality of second DAC cells 130-1, . . . , 130-M will become more evident when comparing the DAC 100 described above with the DAC 200 illustrated in FIG. 2. Contrary to the DAC 100, the DAC 200 does not comprise dummy data driven DAC cells. The DAC 200 solely comprises DAC cells driven based on the first digital data n(t).

The main source of non-linearity in the DAC 200 (e.g. a CDAC) is the finite impedance of the DAC 200's power supply 210. As the power supply 210 acts as the DAC reference, every disturbance on the supply will be directly visible on the DAC output y(t) as a mixing product of the power supply with the DAC input code n(t).

The supply $V_{DD}(t)$ of the DAC 200 can be described as follows:

$$V_{DD}(t) = V_{DC} + i_{DAC}(t) * T(t) = V_{DC} + g(n(t)) * T(t) = V_{DC} + v_d(t)$$

T(t) denotes the impulse response of the supply network 220 that represents the complex impedance of the supply network, $i_{DAC}(t)$ denotes the supply current drawn by the DAC 200, and $V_{DC}$ denotes the DC value of the supply. The function g(x) denotes the non-linear function that maps the DAC input code n(t) to supply current $i_{DAC}(t)$. The function g(x) may be as simple as a rectification g(n(t))=|n(t)| or may be approximated with a polynomial characteristic. $v_d(t)$ denotes the transient and signal dependent part of the supply voltage that is causing the distortion in the DAC output y(t).

The resulting output waveform y(t) of the DAC 200 is proportional to the multiplication of $V_{DD}(t)$ with the DAC input signal n(t) as is shown in the following:

$$y(t) \sim n(t) \times V_{DD}(t)$$

$$y(t) \sim n(t) \times V_{DC} + n(t) \times v_d(t)$$

The term $y_d(t) = n(t) \times v_d(t)$ describes describing the resulting non-linearity in the DAC output y(t).

Referring back to the DAC 100 illustrated in FIG. 1, the current $i_{DAC}(t)$ drawn by the DAC 100 from the power supply 180 may be decorrelated from the first digital data 101 by means of the dummy path. Accordingly, the impedance of the current supply network (i.e. the impedance of the power supply 180 and other intermediate elements such as current supply lines etc.) does no longer result in a transient signal dependent supply voltage. Therefore, the term $v_d(t)$ will be zero or at least close to zero. As a consequence, distortion components such as third and higher order harmonics may be reduced or even cancelled in the first analog signal 111. As a trade-off, the noise level of the first analog signal 111 may increase. However, this is tolerable in many applications.

In FIG. 1, the implementation of the plurality of first DAC cells 110-1, . . . , 110-N and the plurality of second DAC cells 130-1, . . . , 130-M is exemplarily illustrated by the DAC cell 110-1 and the DAC cell 130-1. The DAC cell 110-1 and the DAC cell 130-1 are illustrated as capacitive DAC cells comprising a respective capacitive element 112-1, 132-1 that generates the respective cell output signal based on the output signal of the respective inverter circuit 113-1, 133-1 which is driven based on the first digital data 101 or the second digital data 102, respectively. However, it is to be noted that the plurality of first DAC cells 110-1, . . . , 110-N and the plurality of second DAC cells 130-1, . . . , 130-M may alternatively be resistive DAC cells. In other words, the plurality of first DAC cells 110-1, . . . , 110-N and the plurality of second DAC cells 130-1, . . . , 130-M may comprise a resistive element instead of a capacitive element for generating the respective cell output signal.

The plurality of second DAC cells 130-1, . . . , 130-M may be implemented identical to or different from the plurality of first DAC cells 110-1, . . . , 110-N. According to some example, the plurality of second DAC cells 130-1, . . . , 130-M are capable of driving a signal current that differs less than 50%, 25%, 10%, 5% from a signal current that can be driven by the plurality of first DAC cells 110-1, . . . , 110-N. The more similar the signals currents that can be driven by the plurality of first DAC cells 110-1, . . . , 110-N and the plurality of second DAC cells 130-1, . . . , 130-M are, the more the supply current drawn by the DAC 100 may be decorrelated from the first digital data 101.

Taking into account the switching of the plurality of second DAC cells 130-1, ..., 130-M due to the second digital data 102, the supply voltage $V_{DD}(t)$ of the DAC 100 may be described as follows:

$$V_{DD}(t) = V_{DC} + i_{DAC}(t) * T(t) = V_{DC} + g(n(t) + d(t)) * T(t) = V_{DC} + v_d(t)$$

n(t) denotes the first digital data 101 and d(t) represents the second digital data 102.

The data generation circuit 150 may generate the second digital data 102 in many different ways in order to decorrelate the supply current from the first digital data 101. According to some examples, the data generation circuit 150 may generate the second digital data 102 such that one of the following mathematical expressions is fulfilled:

$$|g(n(t)+d(t))*T(t)|<|g(n(t))|$$

or $$|corr(g(n(t)+d(t))*T(t),n(t))|<|corr(g(n(t))*T(t),n(t))|$$

In the following some non-limiting examples for how to generate the second digital data 102 will be given.

For example, the data generation circuit 150 may be configured to generate the second digital data 102 such that the second analog signal 131 is opposite to the first analog signal 111. In other words, the second digital data 102 may be the exact opposite of the first digital data 101 such that the switching behavior of the plurality of second DAC cells 130-1, ..., 130-M is opposite to the switching behavior of the plurality of first DAC cells 110-1, ..., 110-N. Accordingly, the supply current drawn by the DAC 100 may be kept constant such that also supply voltage does not depend on the first digital data 101. Accordingly, third and higher order distortions in the first analog signal 111 may be suppressed.

In other examples, the data generation circuit 150 may be configured to generate the second digital data 102 such that a temporal progression of a sum of an absolute signal value of the first analog signal 111 and an absolute signal value of the second analog signal 131 is constant. In other words, the second digital data 102 may be generated such that a temporal progression of a sum of an absolute signal value represented by the second digital data 102 and an absolute signal value represented by the first digital data 101 is constant.

In further examples, the data generation circuit 150 may be configured to generate the second digital data 102 such that a signal value of the second analog signal 131 corresponds to a constant value minus an absolute signal value of the first analog signal 111. In other words, the second digital data 102 may be generated such that a signal value represented by the second digital data 102 corresponds to a constant value minus an absolute signal value represented by the first digital data 101. This is illustrated in FIG. 3.

Figure 3:
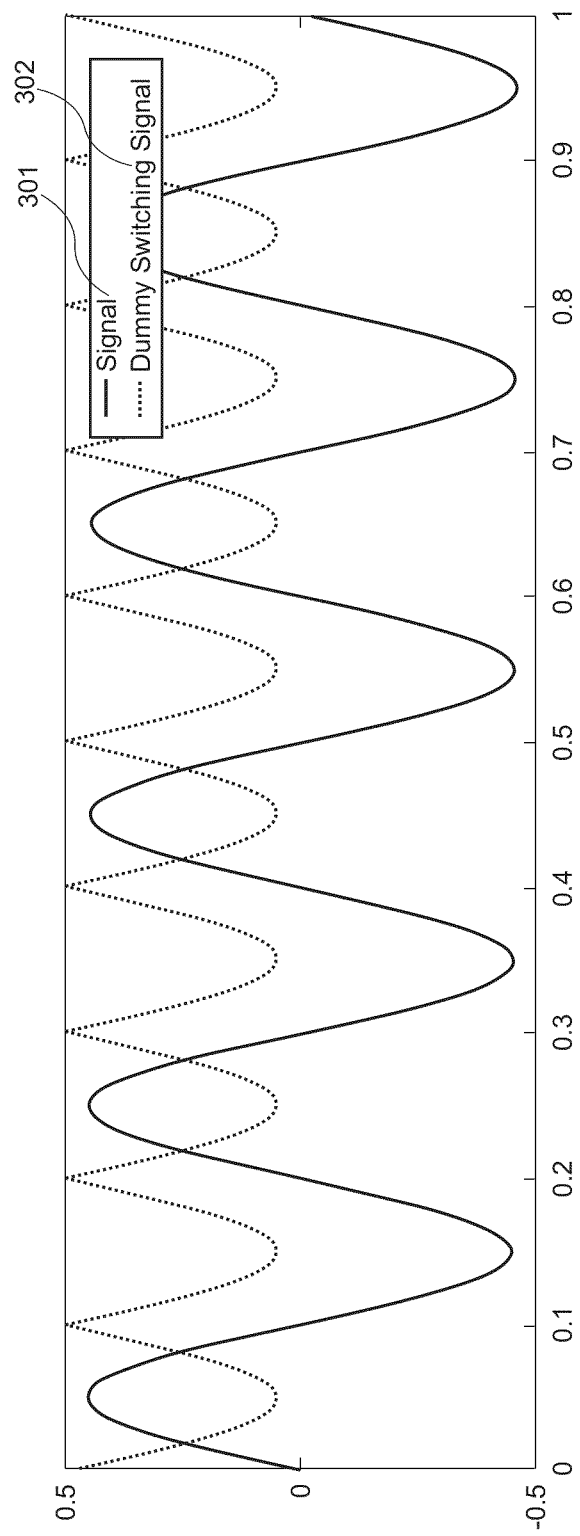
FIG. 3 illustrates exemplary DAC input signals.

FIG. 3 illustrates the temporal progressions of the signal value 301 represented by the first digital data 101 and the signal value 302 represented by the second digital data 102. The temporal progressions of the signal value 302 represented by the second digital data 102 is 0.5 minus the absolute value of signal value 301 represented by the first digital data 101.

Figure 4:
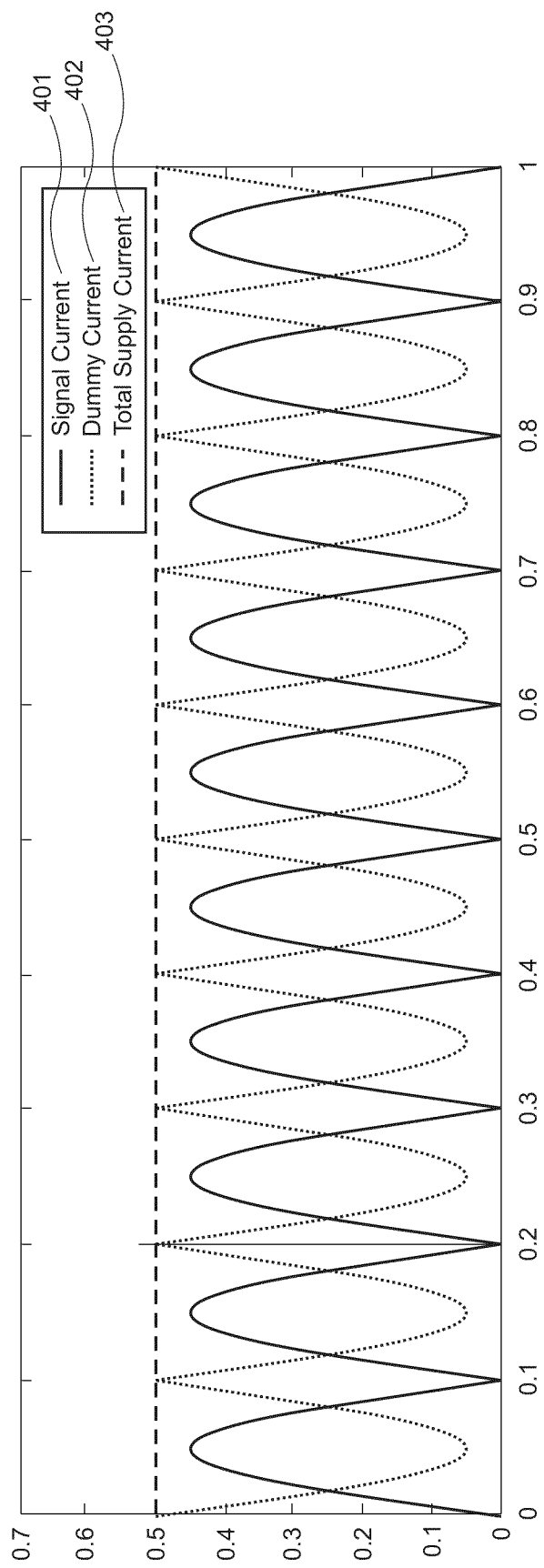
FIG. 4 illustrates exemplary DAC supply currents.

An overview over the resulting supply currents is illustrated in FIG. 4. In particular, the temporal progressions of the supply current 401 drawn by the plurality of first DAC cells 110-1, ..., 110-N, the supply current 402 drawn by the plurality of second DAC cells 130-1, ..., 130-M, and the total supply current 403 drawn by the DAC 100 are illustrated in FIG. 4. As can be seen, the supply currents 401 and 402 add up to a constant total supply current 403 due to the above described structure of the second digital data 102. Therefore, distortions such as third and higher order distortions may be suppressed in the first analog signal 111.

It is to be noted that the total drawn supply current does not necessarily have to be constant. In order to avoid distortion of the first analog signal 111, the drawn supply current is to be input signal/data independent. Creating the dummy data in such a way that the total supply current drawn by the plurality of first DAC cells 110-1, ..., 110-N and the plurality of second DAC cells 130-1, ..., 130-M is input signal/data independent and more noise like does not lead to distortions but only added noise to the first analog signal 111 (i.e. the DAC output) which, depending on the noise level, is tolerable for many applications.

The first load 160 coupled to the first output node 120 and the second load 170 coupled to the second output node 140 may present similar load impedance to the DAC 100 in order to improve the decorrelation of the drawn supply current from the first digital data 101. For example, the load impedances presented to the DAC 100 by the first load 160 and the second load 170 may differ at maximum by a factor of 4, 3, 2 or less. The more similar the load impedances presented to the DAC 100 by the first load 160 and the second load 170 are, the more the supply current drawn by the DAC 100 may be decorrelated from the first digital data 101.

The first load 160 and the second load 170 may, e.g., be integrated in the same semiconductor die as the DAC 100. In alternative examples, at least one of the first load 160 and the second load 170 may be arranged off (outside) the semiconductor die comprising the DAC 100. In other words, at least one of the first load 160 and the second load 170 is not arranged in the semiconductor die in some examples. For example, at least one of the first load 160 and the second load 170 may be integrated in a different semiconductor die than the DAC 100. In other examples, at least one of the first load 160 and the second load 170 may be arranged on or be integrated in a device that is not a semiconductor device. For example, the first load 160 or the second load 170 may be a passive filter arranged on a Printed Circuit Boards (PCB).

Figure 5:
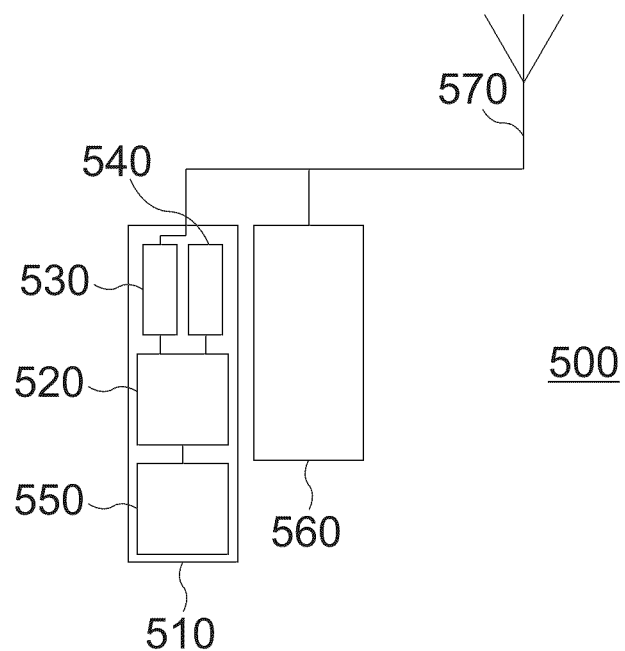
FIG. 5 illustrates an example of a base station.

An example of an implementation using a DAC according to one or more aspects of the architecture described above or one or more examples described above is illustrated in FIG. 5. FIG. 5 schematically illustrates an example of a radio base station 500 (e.g. for a femtocell, a picocell, a microcell or a macrocell) comprising a DAC 520 as proposed.

The DAC 520 is part of a transmitter 510 (being an example for a data processing system). The transmitter 520 additionally comprises digital circuitry 550 (e.g. a Digital Signal Processor, DSP) configured to supply the first digital data to the DAC 520. For example, the digital circuitry 550 may be configured to generate the first digital data based on data to be wirelessly transmitted.

The base station 500 comprises at least one antenna element 570 coupled to the transmitter 510 for radiating one or more Radio Frequency (RF) transmit signals that are based on the DAC output to the environment. For example, the DAC 520 may be coupled to the antenna element 570 via one or more intermediate elements 530 such as a filter, an up-converter (mixer) or a PA. The one or more intermediate elements 530 and/or the antenna element 570 may be understood as exemplary loads coupled to the first output node of the DAC 520. Further illustrated is a second load 540 coupling to the second output node of the DAC 520.

Additionally, the base station 500 comprises a receiver 560 configured to receive a RF receive signal from the antenna element 570 or another antenna element (not illustrated) of the base station 500.

For reasons of simplicity, the power supply of the DAC 520 is not illustrated in FIG. 5.

To this end, a base station using a DAC with increased linearity may be provided. Accordingly, the RF transmit signals may be generated with higher quality compared to conventional approaches.

The base station 500 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit (CPU) cores and one or more of cache memory, a Low-DropOut (LDO) voltage regulator, interrupt controllers, serial interfaces such as Serial Peripheral Interface (SPI), Inter-Integrated Circuit (I²C) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 6:
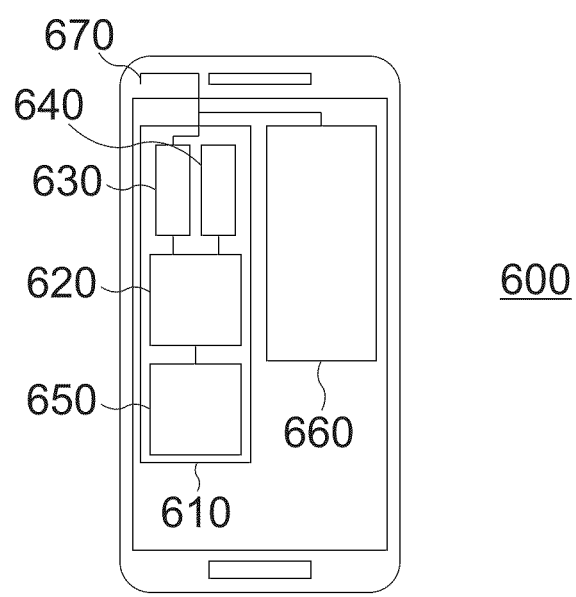
FIG. 6 illustrates an example of a mobile device.

Another example of an implementation using a DAC according to one or more aspects of the architecture described above or one or more examples described above is illustrated in FIG. 6. FIG. 6 schematically illustrates an example of a mobile device 600 (e.g. mobile phone, smartphone, tablet-computer, or laptop) comprising a DAC 620 as proposed.

The DAC 620 is part of a transmitter 610 (being an example for a data processing system). The transmitter 620 additionally comprises digital circuitry 650 (e.g. a DSP) configured to supply the first digital data to the DAC 620. For example, the digital circuitry 650 may be configured to generate the first digital data based on data to be wirelessly transmitted.

The mobile device 600 comprises at least one antenna element 670 coupled to the transmitter 610 for radiating one or more RF transmit signals that are based on the DAC output to the environment. For example, the DAC 620 may be coupled to the antenna element 670 via one or more intermediate elements 630 such as a filter, an up-converter (mixer) or a PA. The one or more intermediate elements 630 and/or the antenna element 670 may be understood as exemplary loads coupled to the first output node of the DAC 620. Further illustrated is a second load 640 coupling to the second output node of the DAC 620.

Additionally, the mobile device 600 comprises a receiver 660 configured to receive a RF receive signal from the antenna element 670 or another antenna element (not illustrated) of the mobile device 600.

For reasons of simplicity, the power supply of the DAC 620 is not illustrated in FIG. 6.

To this end, a mobile device using a DAC with increased linearity may be provided. Accordingly, the RF transmit signals may be generated with higher quality compared to conventional approaches.

The mobile device 600 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using digital-to-analog conversion according to the proposed architecture or one or more of the examples described above may be configured to operate according to one of the 3GPP-standardized mobile communication networks or systems. The mobile or wireless communication system may correspond to, for example, a $5^{th}$ Generation New Radio (5G NR), a Long-Term Evolution (LTE), an LTE-Advanced (LTEA), High Speed Packet Access (HSPA), a Universal Mobile Telecommunication System (UMTS) or a UMTS Terrestrial Radio Access Network (UTRAN), an evolved-UTRAN (eU-TRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Interoperability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

Example 1 is a DAC, comprising: one or more first DAC cells configured to generate a first analog signal based on first digital data, wherein the one or more first DAC cells are coupled to a first output node for coupling to a first load; one or more second DAC cells configured to generate a second analog signal based on second digital data, wherein the one or more second DAC cells are coupled to a second output node for coupling to a second load, and wherein the one or more first DAC cells and the one or more second DAC cells are couplable to a power supply for drawing a supply current; and a data generation circuit configured to generate the second digital data based on the first digital data.

Example 2 is the DAC of example 1, wherein the one or more first DAC cells and the one or more second DAC cells are capacitive DAC cells.

Example 3 is the DAC of example 1 or example 2, wherein the one or more first DAC cells and the one or more second DAC cells are resistive DAC cells.

Example 4 is the DAC of any of examples 1 to 3, wherein the data generation circuit is configured to generate the second digital data such that the second digital data is the opposite of the first digital data.

Example 5 is the DAC of any of examples 1 to 3, wherein the data generation circuit is configured to generate the second digital data such that a signal value represented by the second digital data corresponds to a constant value minus an absolute signal value represented by the first digital data.

Example 6 is the DAC of any of examples 1 to 3, wherein the data generation circuit is configured to generate the second digital data such that a temporal progression of a sum of an absolute signal value represented by the second digital data and an absolute signal value represented by the first digital data is constant.

Example 7 is the DAC of any of examples 1 to 6, wherein the one or more second DAC cells are capable of driving a signal current that differs less than 50% from a signal current that can be driven by the one or more first DAC cells.

Example 8 is the DAC of any of examples 1 to 7, wherein the second load couples the second output node to ground.

Example 9 is a data processing system, comprising: a DAC according to any of examples 1 to 8; a first load coupled to the first output node; and a second load coupled to the second output node.

Example 10 is the data processing system of example 9, wherein load impedances presented to the DAC by the first load and the second load differ at maximum by a factor of 4.

Example 11 is the data processing system of example 9 or example 10, wherein the DAC is integrated in a semiconductor die, and wherein at least one of the first load and the second load is arranged off the semiconductor die.

Example 12 is the data processing system of example 9 or example 10, wherein the DAC is integrated in the same semiconductor die as the first load and the second load.

Example 13 is the data processing system of any of examples 9 to 12, further comprising a power supply coupled to the one or more first DAC cells and the one or more second DAC cells for providing the supply current.

Example 14 is the data processing system of any of examples 9 to 13, wherein the data processing system is a transmitter.

Example 15 is the data processing system of claim 14, wherein the transmitter further comprises digital circuitry configured to supply the first digital data to the DAC.

Example 16 is the data processing system of claim 15, wherein the digital circuitry is configured to generate the first digital data based on data to be wirelessly transmitted.

Example 17 is a base station, comprising: a data processing system according to any of examples 9 to 16; and at least one antenna element coupled to the DAC.

Example 18 is the base station of example 17, further comprising a receiver configured to receive a radio frequency receive signal from the antenna element.

Example 19 is a mobile device, comprising: a data processing system according to any of examples 9 to 16; and at least one antenna element coupled to the DAC.

Example 20 is the mobile device of example 19, further comprising a receiver configured to receive a radio frequency receive signal from the antenna element.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A digital-to-analog converter, comprising:
   one or more first digital-to-analog converter cells configured to generate a first analog signal based on first digital data, wherein the one or more first digital-to-analog converter cells are coupled to a first output node for coupling to a first load;
   one or more second digital-to-analog converter cells configured to generate a second analog signal based on second digital data, wherein the one or more second digital-to-analog converter cells are coupled to a second output node for coupling to a second load, and wherein the one or more first digital-to-analog converter cells and the one or more second digital-to-analog converter cells are couplable to a power supply for drawing a supply current; and
   a data generation circuit configured to generate the second digital data based on the first digital data.

2. The digital-to-analog converter of claim 1, wherein the one or more first digital-to-analog converter cells and the one or more second digital-to-analog converter cells are capacitive digital-to-analog converter cells.

3. The digital-to-analog converter of claim 1, wherein the one or more first digital-to-analog converter cells and the one or more second digital-to-analog converter cells are resistive digital-to-analog converter cells.

4. The digital-to-analog converter of claim 1, wherein the data generation circuit is configured to generate the second digital data such that the second digital data is the opposite of the first digital data.

5. The digital-to-analog converter of claim 1, wherein the data generation circuit is configured to generate the second digital data such that a signal value represented by the second digital data corresponds to a constant value minus an absolute signal value represented by the first digital data.

6. The digital-to-analog converter of claim 1, wherein the data generation circuit is configured to generate the second digital data such that a temporal progression of a sum of an absolute signal value represented by the second digital data and an absolute signal value represented by the first digital data is constant.

7. The digital-to-analog converter of claim 1, wherein the one or more second digital-to-analog converter cells are capable of driving a signal current that differs less than 50% from a signal current that can be driven by the one or more first digital-to-analog converter cells.

8. The digital-to-analog converter of claim 1, wherein the second load couples the second output node to ground.

9. A data processing system, comprising:
   a digital-to-analog converter according to claim 1;
   a first load coupled to the first output node; and
   a second load coupled to the second output node.

10. The data processing system of claim 9, wherein load impedances presented to the digital-to-analog converter by the first load and the second load differ at maximum by a factor of 4.

11. The data processing system of claim 9, wherein the digital-to-analog converter is integrated in a semiconductor die, and wherein at least one of the first load and the second load is arranged off the semiconductor die.

12. The data processing system of claim 9, wherein the digital-to-analog converter is integrated in the same semiconductor die as the first load and the second load.

13. The data processing system of claim 9, further comprising a power supply coupled to the one or more first digital-to-analog converter cells and the one or more second digital-to-analog converter cells for providing the supply current.

14. The data processing system of claim 9, wherein the data processing system is a transmitter.

15. The data processing system of claim 14, wherein the transmitter further comprises digital circuitry configured to supply the first digital data to the digital-to-analog converter.

16. The data processing system of claim 15, wherein the digital circuitry is configured to generate the first digital data based on data to be wirelessly transmitted.

17. A base station, comprising:
 a data processing system according to claim 9; and
 at least one antenna element coupled to the digital-to-analog converter.

18. The base station of claim 17, further comprising a receiver configured to receive a radio frequency receive signal from the antenna element.

19. A mobile device, comprising:
 a data processing system according to claim 9; and
 at least one antenna element coupled to the digital-to-analog converter.

20. The mobile device of claim 19, further comprising a receiver configured to receive a radio frequency receive signal from the antenna element.

* * * * *